United States Patent
Johnson et al.

(10) Patent No.: US 9,543,172 B2
(45) Date of Patent: Jan. 10, 2017

(54) APPARATUS FOR PROVIDING AND DIRECTING HEAT ENERGY IN A PROCESS CHAMBER

(71) Applicant: APPLIED MATERIALS, INC., Santa Clara, CA (US)

(72) Inventors: Joseph Johnson, Palo Alto, CA (US); Joseph M. Ranish, San Jose, CA (US); John Gerling, Lafayette, CA (US); Mathew Abraham, Mountain View, CA (US); Aaron Muir Hunter, Santa Cruz, CA (US); Aneesh Nainani, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 650 days.

(21) Appl. No.: 14/043,091

(22) Filed: Oct. 1, 2013

(65) Prior Publication Data
US 2014/0105583 A1    Apr. 17, 2014

Related U.S. Application Data

(60) Provisional application No. 61/174,963, filed on Oct. 17, 2012.

(51) Int. Cl.
| | |
|---|---|
| F26B 19/00 | (2006.01) |
| F26B 3/30 | (2006.01) |
| F21V 7/00 | (2006.01) |
| F24C 7/00 | (2006.01) |
| H01L 21/67 | (2006.01) |

(52) U.S. Cl.
CPC .... *H01L 21/67115* (2013.01); *H01L 21/67103* (2013.01); *H01L 21/67109* (2013.01)

(58) Field of Classification Search
None
See application file for complete search history.

(56) References Cited

U.S. PATENT DOCUMENTS

| | | |
|---|---|---|
| 5,155,336 A | 10/1992 | Gronet et al. |
| 6,598,559 B1 | 7/2003 | Vellore et al. |
| 6,805,466 B1 | 10/2004 | Ranish |
| 6,818,864 B2 | 11/2004 | Ptak |
| 2003/0029859 A1 | 2/2003 | Knoot et al. |
| 2007/0116443 A1 | 5/2007 | Ptak |
| 2010/0032647 A1 | 2/2010 | Khan et al. |
| 2010/0059497 A1 | 3/2010 | Ranish et al. |
| 2010/0295084 A1 | 11/2010 | Tu et al. |

FOREIGN PATENT DOCUMENTS

| | | |
|---|---|---|
| JP | 2006-114548 | 4/2006 |

OTHER PUBLICATIONS

International Search Report and Written Opinion mailed Jan. 27, 2014 for PCT Application No. PCT/US2013/064240.

*Primary Examiner* — Thor Campbell
(74) *Attorney, Agent, or Firm* — Moser Taboada; Alan Taboada

(57) ABSTRACT

Apparatus for providing heat energy to a process chamber are provided herein. The apparatus may include a process chamber body of the process chamber, a solid state source array having a plurality of solid state sources, disposed on a first substrate, to provide heat energy to the process chamber to heat a target component disposed in the process chamber body, and at least one reflector disposed on the first substrate proximate to one or more of the plurality of solid state sources to direct heat energy provided by the one or more of the plurality of solid state sources towards the target component.

19 Claims, 8 Drawing Sheets

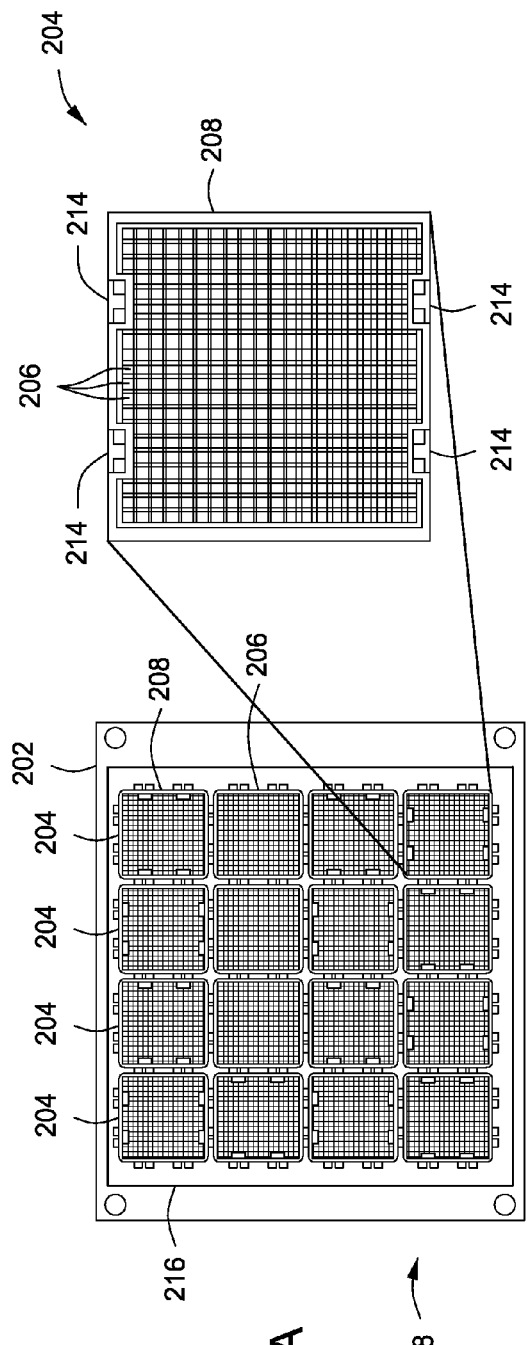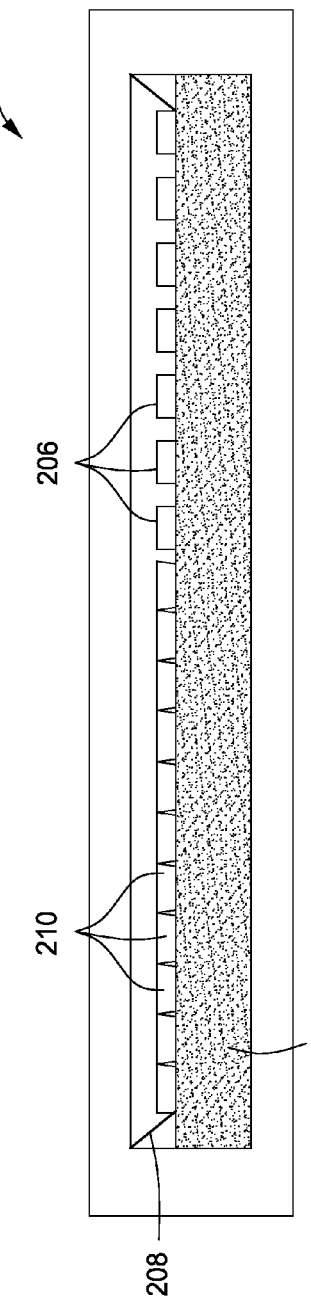

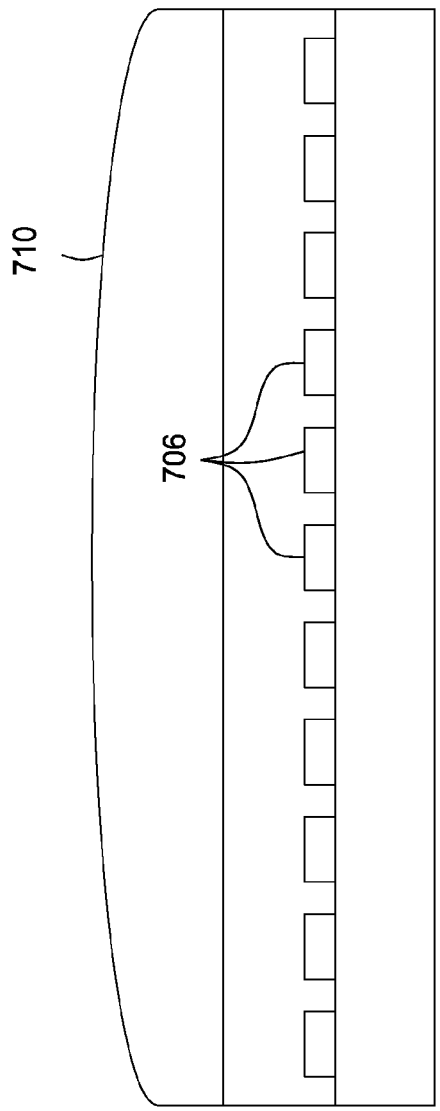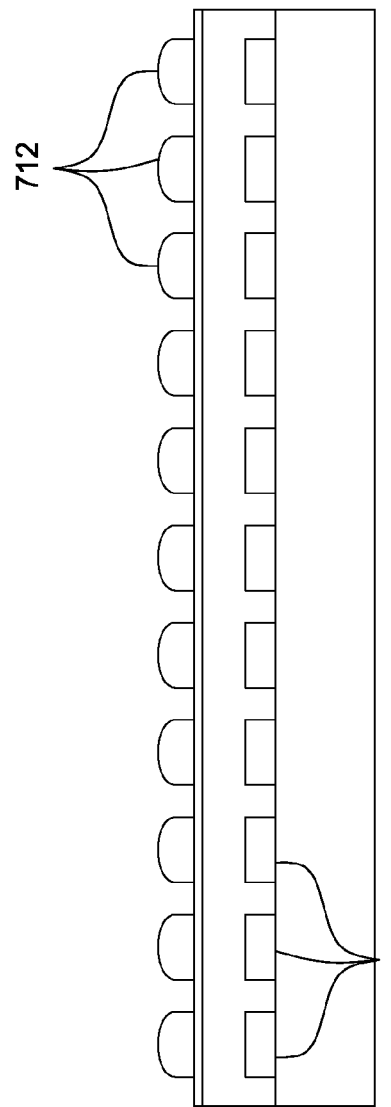

US 9,543,172 B2

APPARATUS FOR PROVIDING AND DIRECTING HEAT ENERGY IN A PROCESS CHAMBER

CROSS-REFERENCE TO RELATED APPLICATIONS

This application claims benefit of U.S. provisional patent application Ser. No. 61/714,963, filed Oct. 17, 2012, which is herein incorporated by reference.

FIELD

Embodiments of the present invention generally relate to semiconductor processing systems and, more specifically, to heat sources for use in semiconductor processing systems.

BACKGROUND

Several applications that involve the thermal processing of substrates such as semiconductor wafers and other materials involve the process steps of rapidly heating and cooling a substrate. One example of such processing is rapid thermal processing (RTP), which is used for a number of semiconductor fabrication processes.

Rapid thermal processing (RTP) radiate heat energy from lamps into the process chamber and onto a semiconductor substrate in the processing chamber. In this manner, the wafer is heated to a required processing temperature. During semiconductor processing operations, the lamps operate at extremely high temperatures. Not all of the heat energy provided by the RTP chamber lamps end up actually heating the wafer. Some of the radiant energy is absorbed by chamber components, especially the reflective components in the radiation field. This is particularly true for emitted energy from point sources which emit light in all directions.

In addition, in the semiconductor industry, it is often desirable to obtain temperature uniformity in the substrate during temperature cycling of substrate. Temperature uniformity provides uniform process variables on the substrate (e.g. layer thickness, resistivity, etch depth) for temperature activated steps such as film deposition, oxide growth, and etching. Furthermore, temperature uniformity in the substrate is necessary to prevent thermal stress-induced substrate damage such as warpage, defect generation, and substrate slip.

Accordingly, the inventors have provided improved heat energy sources, reflectors, and reflector materials for improved reflection of radiation for semiconductor substrate processing.

SUMMARY

Apparatus for providing heat energy to a process chamber are provided herein. The apparatus may include a process chamber body of the process chamber, a solid state source array having a plurality of solid state sources, disposed on a first substrate, to provide heat energy to the process chamber to heat a target component disposed in the process chamber body, and at least one reflector disposed on the first substrate proximate to one or more of the plurality of solid state sources to direct heat energy provided by the one or more of the plurality of solid state sources towards the target component.

In some embodiments, an apparatus for providing heat energy to a process chamber includes a process chamber body of the process chamber, a solid state source array having a plurality of solid state sources, disposed on a first substrate, to provide heat energy to the process chamber to heat a process chamber component disposed in the process chamber; and at least one reflector structure having inclined walls which direct heat energy provided by at least one of the plurality of solid state sources towards the process chamber component, wherein the at least one reflector structure is mounted on the first substrate over the at least one of the plurality of solid state sources such that each of the at least one reflector structure is disposed about at least one of the plurality of solid state sources in the solid state source array.

In some embodiments, an apparatus for providing heat energy to a process chamber includes, a process chamber body of the process chamber, a solid state source array having a plurality of solid state sources, disposed on a first substrate, to provide heat energy to the process chamber to heat a component disposed in the process chamber body, and a reflector array having a plurality of reflector cavities which direct heat energy provided by the plurality of solid state sources towards the component, wherein the reflector array is mounted on the first substrate over the solid state source array such that each of the plurality of reflector cavities is disposed about at least one of the plurality of solid state sources in the solid state source array.

In some embodiments, an apparatus for providing heat energy to a process chamber includes a process chamber body of the process chamber, a solid state source array having a plurality of solid state sources, disposed on a first substrate, to provide heat energy to the process chamber to heat a process chamber component disposed in the process chamber, a plurality of lateral reflectors mounted on the first substrate and substantially perpendicular to the first substrate, and arrayed substantially parallel to each other, each having a plurality of slots disposed along a first lateral edge, and a plurality of transverse reflectors mounted on the first substrate and substantially perpendicular to the first substrate, and arrayed substantially parallel to each other, each having a plurality of slots disposed along a first lateral edge, wherein the slots disposed along the first lateral edges of the plurality of transverse subpanels engage the slots disposed along the second lateral edges of the plurality of lateral subpanels to create a reflector array including at least one rectangular reflector cavity, and wherein each of the at least one rectangular reflector cavity is disposed about at least one of the plurality of solid state sources in the solid state source array to direct heat/light/energy provided by at least one of the plurality of solid state sources towards the process chamber component.

In some embodiments, an apparatus for providing heat energy to a process chamber includes a process chamber body of the process chamber, a solid state source array having a plurality of solid state sources, disposed on a first substrate, to provide heat energy to the process chamber to heat a process chamber component disposed in the process chamber, and at least one light pipe including a reflective outer coating and a solid core to direct heat energy provided by at least one of the plurality of solid state sources towards the process chamber component, wherein the at least one light pipe is mounted on the first substrate over the at least one of the plurality of solid state sources such that each of the at least one light pipe is disposed about at least one of the plurality of solid state sources in the solid state source array.

In some embodiments, an apparatus for providing heat energy to a process chamber includes a process chamber body of the process chamber, a solid state source array having a plurality of solid state sources, disposed on a first substrate, to provide heat energy to the process chamber to heat a process chamber component disposed in the process chamber, at least one reflector disposed on the first substrate proximate to one or more of the plurality of solid state sources to direct heat energy provided by the one or more of the plurality of solid state sources towards the component, and at least one lens disposed between the solid state source array and the process chamber component to be heated, wherein each of the at least one lens directs heat energy provided by at least one of the plurality of solid state sources towards the process chamber component.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIG. 2A is a top view of an LED heat source that includes a plurality of LED arrays in accordance with some embodiments of the present invention.

FIG. 2B is a side cross-sectional view of an LED array in accordance with some embodiments of the present invention.

FIG. 7A is a cross-sectional side view of a single lens over an LED array in accordance with some embodiments of the present invention.

FIG. 7B is a cross-sectional side view of a plurality of lenses over an LED array in accordance with some embodiments of the present invention.

Figure 1:
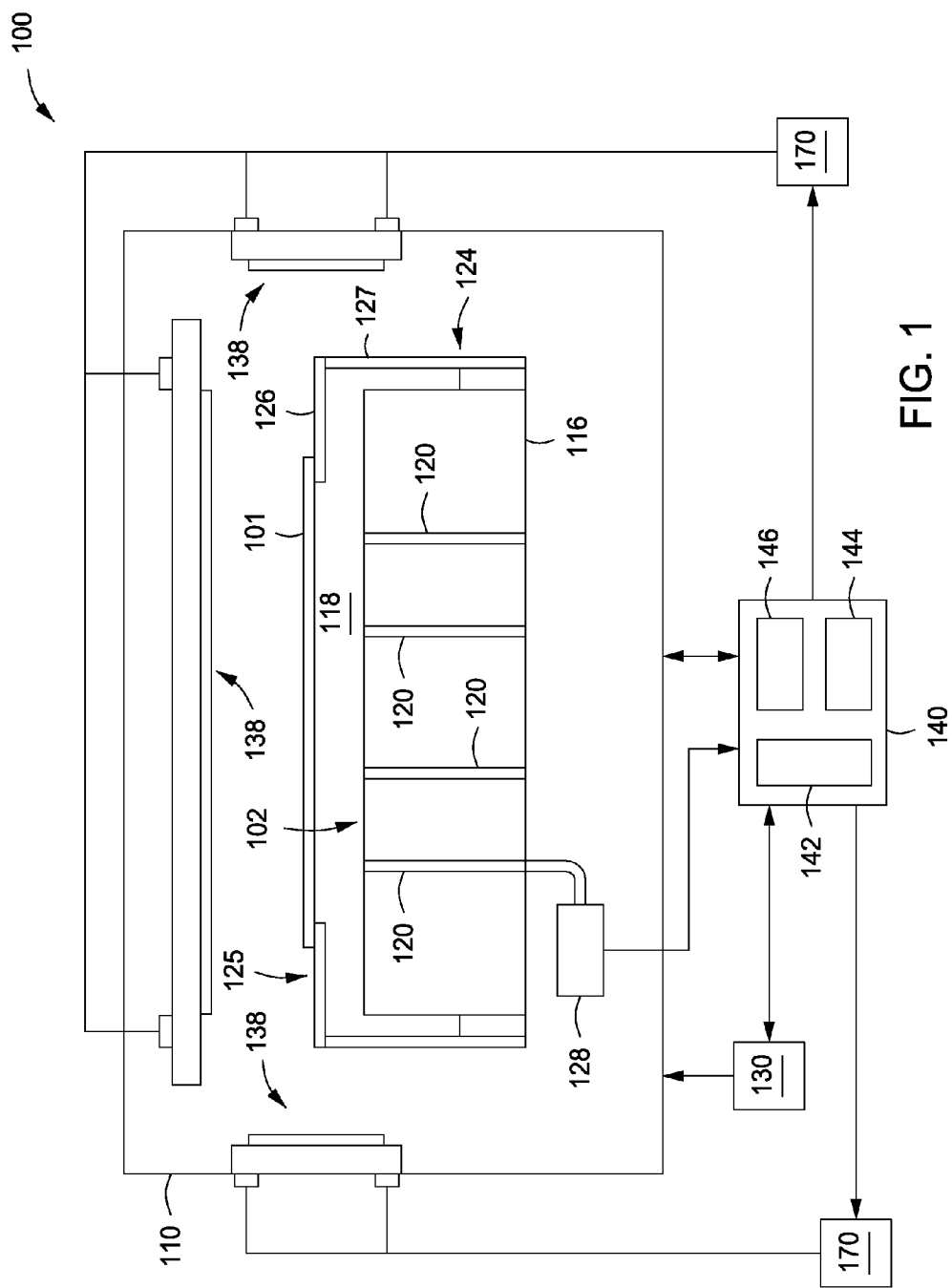
FIG. 1 is a schematic, cross-sectional view of a semiconductor substrate process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for processing substrates are provided herein. In some embodiments, the inventive apparatus may advantageously provide improved heating of substrates and other components disposed in a process chamber through the use of reflectors and/or lenses. More specifically, the inventive apparatus may advantageously control and/or direct light emitted from a solid state source for heating substrates, such as semiconductor wafers, by using reflective devices/materials to direct light from solid state light point sources (e.g., LEDs, LASERs) towards a target.

In the following description, the term substrate is intended to broadly cover any object that is being processed in a thermal process chamber. The term substrate may include, for example, semiconductor wafers, flat panel displays, glass plates or disks, plastic workpieces, and the like. In the following description solid state light point sources include light emitting diodes (LEDs) and LASERs. In addition, although described below in terms of LEDs or arrays of LEDs, LASERs and arrays of LASERs, or other solid state light point sources may be used interchangeably in embodiments described herein.

FIG. 1 depicts a schematic of an exemplary process chamber 100 configured to perform thermal processes, such as a rapid thermal process (RTP), and suitable for use with the inventive LED source for heating substrates in accordance with some embodiments of the present invention. The process chamber 100 may be any type of process chamber having a substrate support configured to support a substrate (e.g., process chamber that includes a substrate support ring, a susceptor which holds the substrate in multiple places, air jets that holds the substrate in place) and having a reflector plate located along a back side of the substrate. Examples of suitable process chambers includes any of the RADIANCE®, RADIANCE® PLUS, or VANTAGE® process chambers, or any other process chamber capable of performing a thermal process, for example RTP, all available from Applied Materials, Inc., of Santa Clara, Calif. Other suitable process chambers, including those available from other manufacturers may also be used and/or modified in accordance with the teachings provided herein. For example, other suitable process chambers that may utilize the inventive LED source for heating substrates described herein include Physical Vapor Deposition (PVD) chambers, Chemical Vapor Deposition (CVD) chambers, Epitaxial Deposition chambers, etch chambers, Atomic Layer Deposition (ALD) chambers, etc.

The process chamber 100 may, for example, be adapted for performing thermal processes and illustratively comprises a chamber body 110, support systems 130, and a controller 140 that includes of a CPU 142, memory 144, and support circuits 146. The process chamber 100 depicted in FIG. 1 is illustrative only and other process chambers, including those configured for processes other than RTP, may be modified in accordance with the teachings provided herein.

The process chamber 100 includes a light-emitting diode (LED) heat source 138, which may include a plurality of LEDs or array(s) of LEDs arranged in zones, wherein each zone of LEDs is separately controllable. In FIG. 1, LED heat sources 138 are shown above the substrate 101 for heating an upper surface of the substrate 101, and on each side of the substrate 101 (which may be used, for example, to heat edge ring 126 which contacts substrate 101). Alternatively (not shown), LED heat sources 138 may be configured to heat the back side of the substrate 101, for example, such as by being disposed below the substrate 101, or by directing the radiation to the back side of the substrate 101. Each LED heat source 138 is coupled to one or more power sources 170 which may be coupled to controller 140 to separately control each LED heat source 138. The temperatures at localized regions of the substrate 101 are measured by a plurality of temperature probe assemblies, such as 120, that passes through a through a hole that extends from the back side of the base 116 through the top of a reflector plate 102. The temperature probe assemblies 120 transmit sampled light from the reflecting cavity 118 to a pyrometer 128. The pyrometer 128 is connected to controller 140 which controls the power supplied to the lamp head 138 in response to a measured temperature. The LED heat sources 138 may be divided into multiple zones. The zones can be individually adjusted by the controller to allow controlled radiative heating of different areas of the substrate 101. In other embodiments, each LED in LED heat sources 138 may be separately controlled to facilitate even finer control of the radiative heating.

In some embodiments, a cooling mechanism may be used to cool the LED heat sources 138. Some exemplary cooling mechanisms may include, for example, the use of heat sinks coupled to a backside of the LED heat sources 138. In some embodiments, the substrate on which the LEDs are mounted may itself be a heat sink used for cooling. In other embodiments, LED heat sources 138 may be cooled by a gas or liquid circulated around or proximate to the LED heat sources 138.

A substrate support 124 included in chamber 100 may include parts of a process kit 125 which may be adapted to work with various embodiments of substrate supports and/or process chambers. For example, the process kit 125 may include elements of the substrate support 124, such as edge ring 126 and an edge ring support 127.

During processing, the substrate 101 is disposed on the substrate support 124. The LED heat source 138 is a source of radiation (e.g., heat) and, in operation, generates a predetermined temperature distribution across the substrate 101. The LED heat source 138 may provide energy in wavelengths ranging from ultraviolet wavelengths to infrared wavelengths (e.g., about 10 nanometers (nm) to about 2000 nanometers (nm)). In some embodiments LED heat source 138 may provide energy in the microwave wavelength range. The LED Array 138 provides heat radiation that is absorbed by the substrate 101. Although some of the heat radiation produced by an LED source may be reflected, substantially all of the heat radiation that is not reflected is absorbed by the target component being heated.

In the exemplary processing chamber 100 described above, LED heat source 138 may be used to illuminate and heat the surface of a substrate to process the near surface region of the substrate. LED light sources offer a variety of advantages including higher efficiency and more rapid response times. Pulse widths are selectable and can range to less than a millisecond to more than a second.

In some embodiments, LED arrays 138 may be used in conjunction with processing chambers to form films, treat dopants, change process gases (e.g., break bonds), and reorder the substrate itself. Additional high temperature substrate processing may benefit from LED heating as even higher output intensities become available. LEDs offer advantages when used to process the near surface region of a substrate. LEDs last a long time and allow the output intensity to be chosen independent from the wavelength(s) of the output illumination. Light emitting diodes (LEDs) may consist of gallium nitride, aluminum nitride, combinations thereof or other III-V materials grown on a substrate constructed to emit light close to one or more wavelengths determined by the bandgap of III-V materials in the active region. A phosphor may also be used to convert an emitted wavelength to a longer wavelength, reducing the energy of an emitted wavelength. It will be understood that the solid state sources described herein and depicted in the remaining figures may employ a phosphor in order to enhance absorption or enhance a chemical reaction.

Depending on the chemistries involved, illuminating a surface in the presence of gas precursor can enhance the rate of chemical reactions by thermal or other means. For example, the light may excite gas phase molecules, adsorbed molecules, or even electronically excite the substrate to promote a chemical reaction on the surface. The wavelength of the LED may be selected to promote desirable film processes by, for example, choosing a wavelength which is resonant with a molecular electronic transition in order to enhance a reaction rate. The wavelength may also be chosen to enhance absorption of the radiation by the substrate, thereby heating the substrate more efficiently.

In some embodiments, each LED heat source 138 in FIG. 1 may include one large array of LEDs. However, depending on the heat energy and area to be heated, one large array of LEDs may require more power than can safely be provided without damage to the LEDs and associated circuitry. The inventors have observed that by modularizing LEDS into a plurality of smaller LED arrays, the smaller LED arrays can be more easily handled, manufactured, and powered. In addition, a plurality of smaller arrays of LEDs may also help in the event of LED failure. For example, in some embodiments, if one led fails and becomes an open circuit, then only the heat emitted from the small LED array is lost. If one large array of LEDs is used, then one LED failure may cause all processing to stop. In some embodiments, each of the plurality of smaller LED arrays can have different modules with different wavelengths. In some embodiments, each LED array can be removed and replaced with another LED array with different wavelengths.

FIGS. 2A and 2B show at least one exemplary embodiment of an LED heat source 138 that includes a plurality of LED arrays 204 disposed on a LED substrate 202 for thermally processing other substrates and/or heating various processing chamber components disposed in the processing chamber. In some embodiments, LED heat source 138 may illustratively be between 100 mm and 480 mm in length and between 100 mm and 480 mm in width. In addition, various size LED heat sources 138 may be used as required or desired in any particular application. In some embodiments, each LED array 204 may be about 20 mm by about 20 mm square, although other size LED arrays 204 may be used. Each LED array 204 may contain between about 300 and about 500 LEDs 206 (e.g., 384 LEDs as shown in FIG. 2B). LEDs 206 may be spaced between about 0.2 mm and about 1 mm apart. LED arrays 204 may be spaced between about 0.5 mm and about 4 mm apart.

Each of the plurality of LED arrays 204 includes a plurality of LEDs 206. For example, in some embodiments, at least one of the plurality of LED arrays 204 may include 384 LEDs as shown in FIG. 2B. Each LED 206 in LED arrays 204 may emit light and heat energy from one or more exposed surfaces. In some embodiments, all exposed surfaces of each LED 206 may emit light and heat energy. In some embodiments, each LED may be about 0.7 mm by about 0.7 mm square and about 0.3 mm in height, although other size LED 206 may be used.

In some embodiments each LED 206 may be individually mounted on LED substrate 202. Each LED 206 may be mounted to the substrate via eutectic bonding, including wire-bond-free direct attach LEDs. To direct attach LEDs to a substrate, a flux is first disposed on the substrate surface to which the LEDs will be attached. The LEDs are then disposed over this surface. The LEDs and the surface are then heated with a certain heating profile. An amount of solder disposed on the bottom of the LED will melt with help of the flux, and will attach the LED to the fluxed surface. In some embodiments, LEDs 206 may be attached via wire-bonding. In addition, each LED 206 may be built on or grown on LED substrate 202.

In some embodiments, each LED array 204 may include a base substrate 212. Each LED 206 may be individually mounted, grown, or built on base substrate 212 as described above with respect to LED substrate 202. Each LED array 204 including base substrate 212 may be mounted to LED substrate 202.

The LED substrate 202 that LED arrays 204 are mounted to, grown on, or built on, may be an n-type LED substrate 202, with an electrode attached to the p-type layer deposited on its surface. P-type substrates or sapphire substrates may be used as well. Similarly, the base substrate 212 may be an n-type substrate, with an electrode attached to the p-type layer deposited on its surface. In some embodiments, the substrate can be any material that is thin enough, or has a high thermal conductivity, such that it is able to dissipate heat from the LEDs quickly while also providing electrical isolation of the LEDs from the rest of the system. In some embodiments, this can be done by using an electrically isolating material or by using a dielectric layer. In some exemplary embodiments, the substrate can be ceramic or metal. For example, in some embodiments, a copper substrate may be used to mount the LEDs on, which is then eutectically bonded to a larger copper heat sink. In some exemplary embodiments, the substrate could function as a heat sink as well. In addition, the substrate may function as electrically insulating material (insulating LEDs from short circuiting).

Each LED array 204 may include electrical contact terminals 214 which may be coupled to a power source to supply power to the LED array 204. In some embodiments, the electrical contact terminals 214 may contact terminals on the LED substrate 202 which are coupled to a power source to provide power to the plurality of LED arrays 204. Some embodiments may have electrical contacts that directly connect to the LED terminals and not through the substrate. In other embodiments, internal wires beneath the surface of the substrate that may connect all the LEDs and then bring all the connections to a surface terminal away from the LEDs.

In some embodiments, each LED array 204 includes a reflector 208 disposed on one or more sides of the LED array 204. In addition, in some embodiments, some or all of the LEDs 206 in LED array 204 may include a reflector 210 disposed on one or more sides of the LED 206. In addition, a reflector 216 may be disposed around the perimeter of all LED arrays 204. Reflectors 208, 210, 216 are configured reflect the light and heat energy emitted from the LED towards the desired target (e.g., wafer substrate, or other process chamber component, etc.). In the case of LASERS, the reflectors 208, 210, 216 could direct the light off of the LASER beams' axis to heat a wafer substrate or desired process chamber component. The reflectors 208 and 210 may be angled to reflect radiated LED light in a desired direction. In some embodiments, the angles of the incline of the reflector surfaces from the LED substrate 202 surface is between about 45 to 55 degrees from an axis of the LED extending in a direction toward where light energy is desired (e.g., for a planar array of LEDs, the axis may be perpendicular to the planar array), however, any angle which maximizes the angle and desired length of the reflector based on the space available between two neighboring LEDs 206, or LED arrays 204, may be used. In other embodiments, the surfaces of the reflectors 208, 210, 216 may be perpendicular to the surface of the LED substrate 202. Still, in other embodiments, the surface of the LEDs 206 may be angled instead of, or in addition to, the surface of the reflector. In some embodiments, the height of the reflectors 208, 210, 216 is at least the same height as the height of the LEDs 206, but may be higher or lower than the LEDs 206 as required.

In some embodiments, reflectors 208 and 210 may be mounted between each LED 206 and each neighboring LED 206 to direct the light and heat energy provided by the LED and the neighboring LED towards the desired target. In other embodiments, reflectors 208 and 210 may be positioned around the periphery of a group of LEDs 206 and/or around the periphery of LED array 204. Reflectors 208, 210, 216 may be mounted directly to LED substrate 202. In some embodiments, Reflectors 208, 210 may be mounted directly to base substrate 212. In some embodiments, reflectors 208, 210, 216 may be placed over LEDs 206 and/or LED arrays 204, and then an epoxy may be poured over LEDs 206 and reflectors 208, 210, 216 to both provide a protective coating and to mount to substrates 202 or 212. In other embodiments, reflectors 208, 210, 216 may be glued to substrates 202 or 212. Still in other embodiments, reflectors 208, 210, 216 may be grown on a silicon substrate.

Reflectors 208, 210, 216 may be made from any reflective material, such as metal, metal alloy, polished plastic, reflective epoxy, or glass. In some embodiments, the body of the reflectors 208, 210, 216 may be made of non-reflective material and coated with a reflective surface coating.

Reflectors 208, 210, 216 may be made in a number of different ways. In some embodiments, the reflectors 208, 210, 216 may be formed via a stamping process that is able to ensure tight dimensional tolerances, and allows very thin metal to be bent at certain angles so that light would bounce off the metal and be directed toward a target. In some embodiments, the shape of the reflectors 208, 210, 216 may be formed by injection molding. In embodiments where the reflectors 208, 210, 216 are formed by injection molded plastic, the reflector may be plated with aluminum or other suitable material for efficiently reflecting the heat energy emitted from the LEDs 206. In some embodiments, the reflectors may be formed by laser cutting, etching, wire-cut Electrical Discharge Machining (EDM), or electro-forming. Still in other embodiments, an epoxy may be poured over the LEDs 206 and the desired shape of reflectors 208, 210, 216 may be stamped in the hardened epoxy between LEDs 206 or LED arrays 204. In some embodiments, reflector 208, 210, 216 surrounding each LED 206 or LED arrays 204 may be a reflective acrylic dam which contains the epoxy poured over LEDs 206 and/or LED arrays 204. In some embodiments, reflector 208, 210, 216 may be formed by holes punched in a metal sheet to allow for the reflectors 208, 210, 216 to sit around the LEDs and LED arrays at board level.

In the illustrative embodiments described herein, the target substrate may bow, for example up to about 5 mm, during heating. Thus, in some embodiments, the LEDs and reflectors should be placed just far enough away to avoid contact if the target substrate bows, but close enough to provide the necessary uniform heat energy to the target substrate. In some embodiments, the reflectors and/or LEDs may be bowed or shaped to compensate for the target substrate deformation.

Various LED/reflector configurations consistent with the description above with respect to FIGS. 2A and 2B are described below in further detail with respect to FIGS. 3-6.

Figure 3:
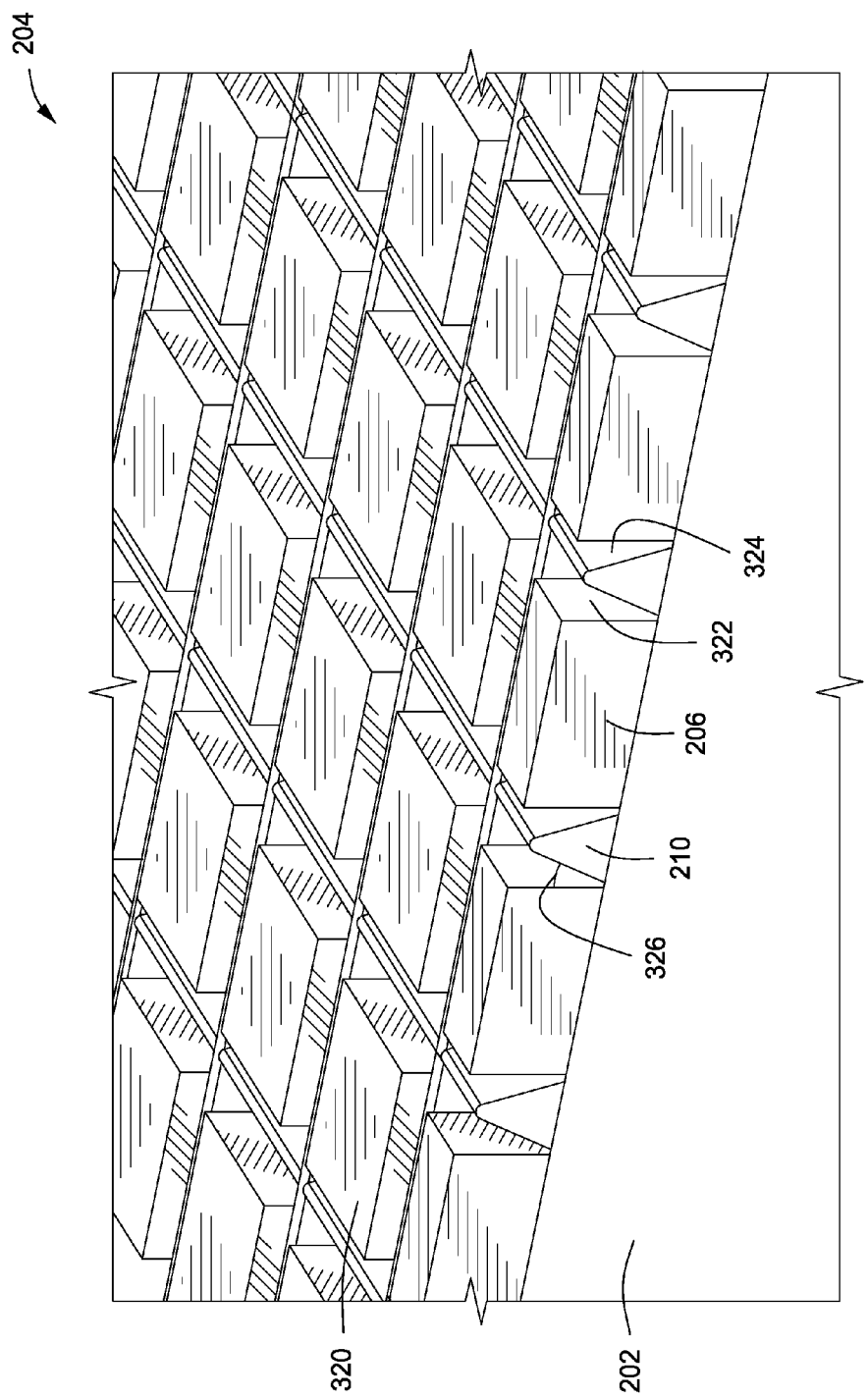
FIG. 3 is a three dimensional view of an LED array including a plurality of LEDs and reflectors in accordance with some embodiments of the present invention.

FIG. 3 shows an exemplary LED array 204 including a plurality of LEDs 206 and reflectors 210 disposed about each LED in accordance with at least one embodiment of the present invention. Each LED 206 may emit light and heat energy from one or more exposed surfaces 320 and 322. In some embodiments, all exposed surfaces of each LED 206 may emit light and heat energy. Reflectors 210 are disposed next to the LEDs in order to reflect the light and heat energy emitted from the LED towards the desired target (e.g., substrate, or other process chamber component, etc.). In some embodiments consistent with FIG. 3, the reflectors 210 may be in the geometric shape of a triangular prism, although other geometric shapes may also be used such as rectangular, square, circular, concave, convex, etc.

In some embodiments the reflectors 210 are angled to reflect radiated LED light in a desired direction (e.g., toward the substrate or other chamber component to be heated). In some embodiments, the angles of the incline 326 of the reflector surfaces 324 from the LED substrate 202 surface is about 45 degrees but may be any angle which maximizes the angle based on the space available between two neighboring LEDs 206. In other embodiments, the surfaces of the reflectors 210 may be perpendicular to the surface of the substrate. The height of the reflectors 210 is preferably at least the same height as the height of the LEDs 206 but may be higher or lower than the LEDs 206 as desired.

In some embodiments, reflectors 210 may be mounted between each LED 206 and each neighboring LED 206 to direct the light and heat energy provided by the LED and the neighboring LED towards the desired target. In other embodiments, reflectors 210 may be positioned around the periphery of a group of LEDs 206 and/or around the periphery of LED array 204. In other words, a reflector may be places around each individual LED, pluralities of arrays of LEDs, or around the entire LED array.

Figure 4:
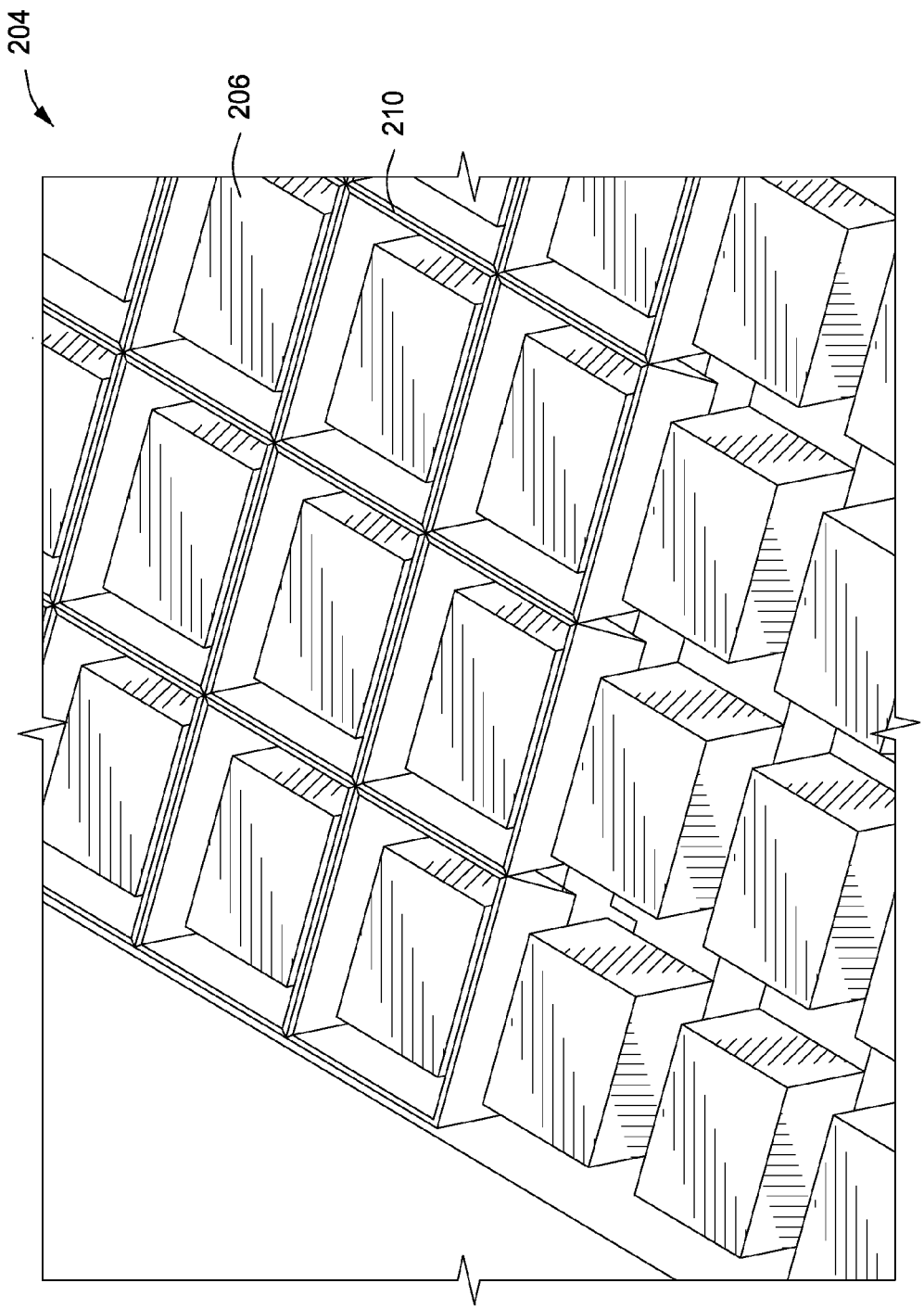
FIG. 4 is a three dimensional view of another LED array including a plurality of LEDs and reflectors in accordance with some embodiments of the present invention.

FIG. 4 shows another exemplary LED array 204 including a plurality of LEDs 206 and reflectors 210 disposed about each LED in accordance with at least one embodiment of the present invention. In FIG. 4, each reflector 210 is in the form of a box which can be mounted over each LED 206. The walls of the each reflector box 210 are angled to reflect the heat and light energy from LED 206 towards the desired target.

Figure 5A:
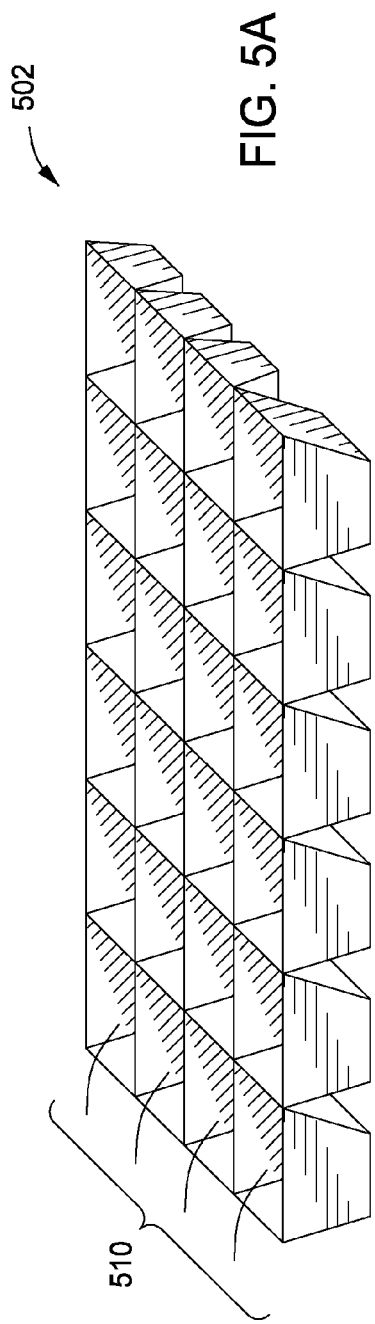
FIGS. 5A and 5B are three dimensional and top views of a reflector array in accordance with some embodiments of the present invention.
Figure 5B:
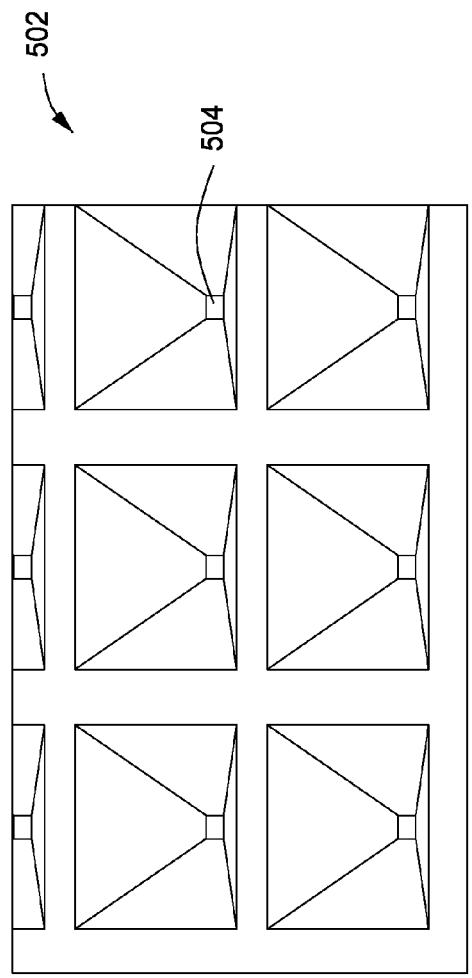

FIGS. 5A and 5B are three dimensional and top views of a reflector array 502 that may be used in embodiments consistent with the present invention. The reflector array 502 consists of a plurality of reflector bays 510. In some embodiments, each reflector bays 510 may correspond to a reflector 210 around each LED 206 as described above with respect to FIGS. 2A and 2B. Each reflector bay 510 has an opening 504 at the bottom which can accommodate an LED 206 described above with respect to FIGS. 2A and 2B. In some embodiments, the opening 504 at the bottom is smaller than the opening at the top. The reflector array 502 may be placed over an array of LEDs 204 disposed on a LED substrate 202. The reflector array 502 may be mounted to LED substrate 202 or 212 as described above with respect to FIGS. 2A and 2B.

In some embodiments, the reflector array 502 may be formed by, but not limited to, potassium hydroxide (KOH) etching. The KOH etches a silicon substrate along its crystal structure and forms holes in a desired shaped as shown in FIG. 5B.

Figure 6A:
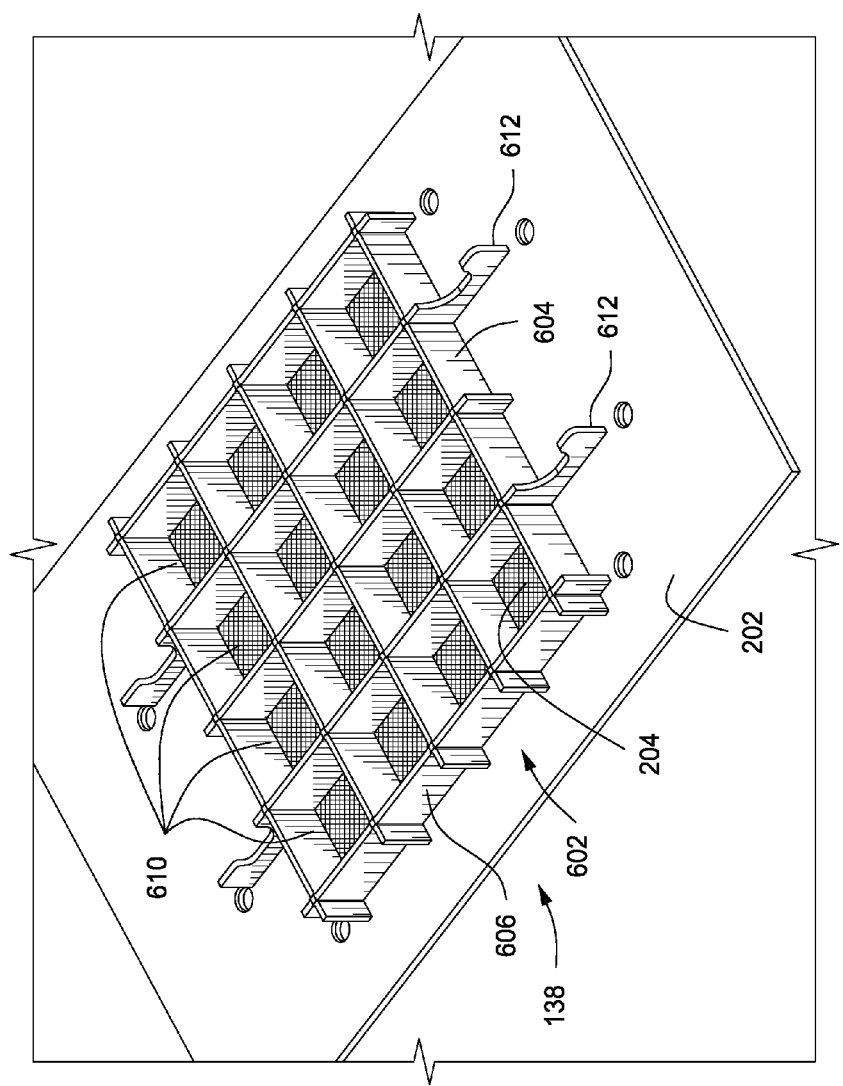
FIG. 6A is a three dimensional view of a lattice reflector array in accordance with some embodiments of the present invention.
Figure 6C:
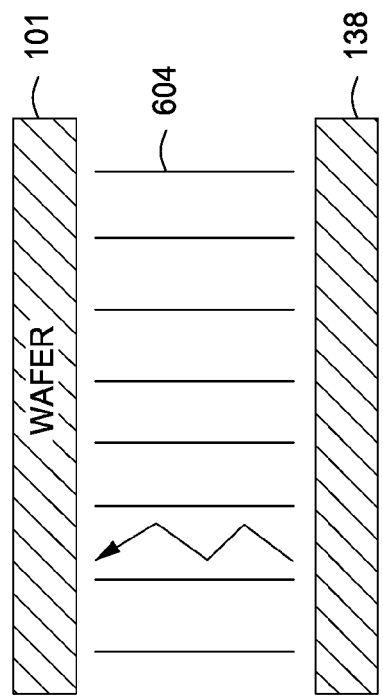
FIG. 6C is a cross-sectional side view of a lattice reflector array reflecting light in accordance with some embodiments of the present invention.

FIG. 6A is a three dimensional view of a lattice reflector array 602 that may be used in heat source 138 to reflect and redirect light toward a target such as substrate 101 in FIG. 1. The lattice reflector array 602 would function as a conduit that is disposed over each LED array 204 so that the LED light could shine through the conduit. The wall of the conduit would be very reflective so that the light could travel all the way up the conduit. Once the light exits the conduit, the substrate 101 would be very close. This is effectively moving the LED light source closer to the substrate 101 without worrying about focusing/columation of the light as shown in FIG. 6C. This could be a series of conduits, or a grid of square conduits (possibly made by interlocking sheets of metal/quartz at 90 degrees angles). The sides of the conduits could be naturally reflective, or could be coated with a reflective material. The lattice reflector array 602 allows more of the light to be directed at a target or effectively moving a light source closer to the wafer.

The lattice reflector array 602 may consists of a plurality of reflector bays 610. Each reflector bay may be square, rectangular, or other type of shape. In some embodiments, each reflector bay 610 may correspond to a reflector 208 around each LED array 204 as described above with respect to FIGS. 2A and 2B. Each reflector bay 610 has an opening at the top, and an opening at the bottom which can accommodate an LED array 204 described above with respect to FIGS. 2A and 2B. The lattice reflector array 602 may be placed over arrays of LEDs 204 disposed on a LED substrate 202. The lattice reflector array 602 may be mounted to LED substrate 202 as described above with respect to FIGS. 2A and 2B.

Figure 6B:
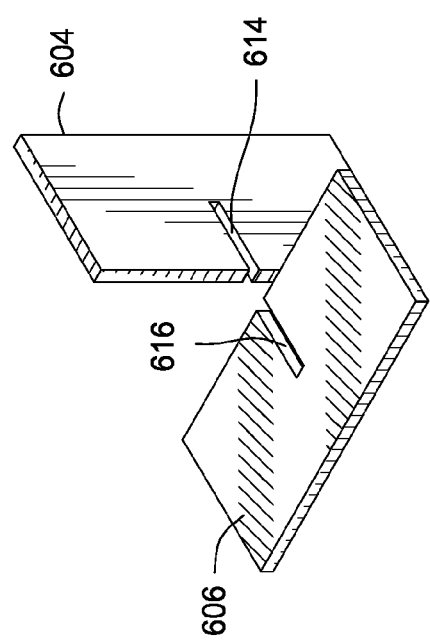
FIG. 6B is an exploded three dimensional view of a lattice reflector array in accordance with some embodiments of the present invention.

The lattice reflector array 602 includes a plurality of a first set of reflector panels 604 that may be coupled to a second set of reflector panels 606. The first and second set of reflector panels 604, 606 may be coupled or interlocked using slots 614 and 616 as shown in FIG. 6B. The lattice reflector array 602 may include additional features 612 for stabilizing and mounting the lattice reflector array 602 to LED substrate 202. In addition, in some embodiments, lattice reflector arrays 602 may be stacked on top of each other. In some embodiments, lattice reflector arrays 602 could be machined from a solid block of material, formed by injection molding, or the like.

In some embodiments, each reflector bay 610 may be filled with a solid material, such as, but not limited to, glass for example. The light from the LEDs is reflected inside of a solid glass light pipe instead of through air. This allows the light to be totally internally reflected, losing very little of the light. For example, in some embodiments, the LED heat source 138 may be placed three meters away from target substrate 101 and use the solid light pipe to transport the light from the LEDs to the target substrate 101 without losing any energy. This would advantageously help with heat management.

In some embodiments, any of the reflectors discussed above with respect to FIGS. 2A-6 could be used in conjunction with one or more lens to increase the amount of light reaching the target. Since LEDs are point sources, the light emitted from LEDs needs to be focused to capture as much energy as possible. Various possible ways to use lens to focus LED light may include, but is not limited to, placing a single lens 710 over a collection of LEDs as shown in FIG. 7A, placing a lens 712 over each LED 706 as shown in FIG. 7B (i.e., a plurality of lens such that each lens is associated with one LED), or flowing water over the surface of the LEDs through a parabolic channel to act as a lens (now shown). Other varying patterns of lenses above the LEDs may also be used. For example, in some embodiments, lens may be shaped to direct multiple LED light away from the center focal point.

In some embodiments, the lens 710, 712 lenses could be used to direct light in addition to focusing it. Multiple layers of lenses could also be used to help further focus the light. In some embodiments, lenses 710, 712 could also be used to make sure the light is distributed evenly over the surface of the substrate being processed/heated. In some exemplary embodiments, the lenses could be planar (e.g., Fresnel lens style). As used herein, lenses can be described as any surface disposed between the light source and substrate that modifies characteristics of the light.

Lens may also be fabricated from any material able to transmit and refract light, for example, glass, epoxy, plastics, crystal, quartz, and the like. In some embodiments, the lens 710, 712 could be made by grinding glass to create a lens or pouring epoxy over a textured surface and curing it.

In some embodiments, the lens 710, 712 may be mounted over the LEDs 706 by embedding them in an epoxy poured over the LEDs 706. In other embodiments, the lens 710, 712 may be glued in place. Still in other embodiments, a separate lens structure including the one or more lens 710, 712 may be disposed between the LEDs 706 and the target being heated. In some embodiments, the lens may be grown. For example, growing SiO2 could provide a transparent layer that is machined or etched to a desired lens.

While the foregoing is directed to embodiments of the present invention, other and further embodiments of the invention may be devised without departing from the basic scope thereof.

The invention claimed is:

1. An apparatus for providing heat energy to a process chamber, the apparatus comprising:
   a process chamber body of the process chamber;
   a solid state source array having a plurality of solid state sources, disposed on a first substrate, to heat a target component disposed in the process chamber body; and
   at least one reflector disposed on the first substrate proximate to one or more of the plurality of solid state sources to direct heat energy provided by the one or more of the plurality of solid state sources towards the target component, wherein the at least one reflector has a geometric configuration in a form of a triangular prism.

2. The apparatus of claim 1, wherein a surface of the at least one reflector is angled to reflect radiated solid state sourcelight toward the target component.

3. The apparatus of claim 1, wherein the at least one reflector (a) is disposed between at least two of the plurality of solid state sources and (b) directs the heat energy provided by the at least two of the plurality of solid state sources towards the component.

4. The apparatus of claim 1, wherein the at least one reflector (a) is disposed about a periphery of the solid state source array and (b) directs heat energy provided by the solid state source array towards the component.

5. The apparatus of claim 1, wherein the at least one reflector includes a plurality of reflectors, and wherein the plurality of reflectors are disposed about a periphery of each of the plurality of the solid state sources.

6. The apparatus of claim 1, wherein the plurality of solid state sources are light emitting diodes (LEDs).

7. The apparatus of claim 6, wherein each of the LEDs provide energy at wavelengths ranging from about 100 to about 2000 nanometers.

8. The apparatus of claim 6, wherein each of the LEDs is comprised of at least one of gallium nitride or aluminum nitride.

9. The apparatus of claim 6, wherein each of the LEDs provides energy at wavelengths ranging from about 300 to about 5000 nanometers.

10. The apparatus of claim 6, wherein each of the LEDs is a wire-bond-free direct attach LED.

11. The apparatus of claim 1, wherein each of the plurality of solid state sources are LASERS.

12. The apparatus of claim 1, wherein the at least one reflector is mounted directly to the first substrate.

13. The apparatus of claim 1, wherein the at least one reflector is grown directly on the first substrate.

14. The apparatus of claim 1, wherein the at least one reflector is formed by a stamping process to create a desired shape and angle of reflector surfaces.

15. The apparatus of claim 1, wherein the at least one reflector is formed by at least one of laser cutting, etching, wire-cut Electrical Discharge Machining (EDM), or electroforming.

16. An apparatus for providing heat energy to a process chamber, the apparatus comprising:
    a process chamber body of the process chamber;
    a solid state source array having a plurality of solid state sources, disposed on a first substrate, to heat a target component disposed in the process chamber body; and
    at least one reflector disposed on the first substrate proximate to one or more of the plurality of solid state sources to direct heat energy provided by the one or more of the plurality of solid state sources towards the target component,
    wherein a reflective acrylic dam is disposed around a perimeter of the solid state source array and configured to contain an epoxy poured over each of the plurality of solid state sources and the at least one reflector.

17. The apparatus of claim 1, wherein the at least one reflector is a reflector array having a plurality of reflector cavities which direct heat energy provided by the plurality of solid state sources towards the component, and wherein the reflector array is formed via a potassium hydroxide (KOH) etching process.

18. An apparatus for providing heat energy to a process chamber, the apparatus comprising:
    a process chamber body of the process chamber;
    a solid state source array having a plurality of solid state sources disposed on a first substrate to heat a process chamber component disposed in the process chamber;
    a plurality of lateral reflectors mounted on the first substrate and substantially perpendicular to the first substrate, and arrayed substantially parallel to each other, each having a plurality of slots disposed along a first lateral edge; and
    a plurality of transverse reflectors mounted on the first substrate and substantially perpendicular to the first substrate, and arrayed substantially parallel to each other, each having a plurality of slots disposed along a first lateral edge,
    wherein the slots disposed along the first lateral edges of the plurality of transverse reflectors engage the slots disposed along the first lateral edges of the plurality of lateral reflectors to create a reflector array including at least one rectangular reflector cavity, and
    wherein each of the at least one rectangular reflector cavity is disposed about at least one of the plurality of solid state sources in the solid state source array to direct heat energy provided by at least one of the plurality of solid state sources towards the process chamber component.

19. An apparatus for providing heat energy to a process chamber, the apparatus comprising:
a process chamber body of the process chamber;
a solid state source array having a plurality of solid state sources, disposed on a first substrate, to heat a process chamber component disposed in the process chamber;
at least one reflector disposed on the first substrate proximate to one or more of the plurality of solid state sources to direct heat energy provided by the one or more of the plurality of solid state sources towards the component; and
at least one lens disposed between the solid state source array and the process chamber component to be heated, wherein each of the at least one lens directs heat energy provided by at least one of the plurality of solid state sources towards the process chamber component.

* * * * *